（12） United States Patent
Yeh

(10) Patent No.: US 9,281,020 B2
(45) Date of Patent: Mar. 8, 2016

(54) STORAGE MEDIUM AND ACCESSING SYSTEM UTILIZING THE SAME

(71) Applicant: Winbond Electronics Corp., Taichung (TW)

(72) Inventor: Jun-Lin Yeh, Jhubei (TW)

(73) Assignee: Winbond Electronics Corp., Taichung (TW)

( * ) Notice: Subject to any disclaimer, the term of this patent is extended or adjusted under 35 U.S.C. 154(b) by 256 days.

(21) Appl. No.: 13/662,551

(22) Filed: Oct. 29, 2012

(65) Prior Publication Data

US 2014/0122813 A1  May 1, 2014

(51) Int. Cl.
*G11C 7/00* (2006.01)
*G11C 5/06* (2006.01)
*G11C 7/10* (2006.01)
*G11C 8/06* (2006.01)

(52) U.S. Cl.
CPC ............... *G11C 5/066* (2013.01); *G11C 7/109* (2013.01); *G11C 7/10* (2013.01); *G11C 8/06* (2013.01)

(58) Field of Classification Search
CPC .......... G11C 5/066; G11C 7/109; G11C 7/10; G11C 8/06

USPC .......... 365/189.15, 193, 189.05, 194, 230.06, 365/233.1

See application file for complete search history.

(56) References Cited

U.S. PATENT DOCUMENTS

| | | | |
|---|---|---|---|
| 2007/0121376 A1* | 5/2007 | Toda | 365/185.2 |
| 2010/0182856 A1* | 7/2010 | Koshizuka | 365/193 |
| 2010/0202224 A1* | 8/2010 | Oh | 365/193 |
| 2012/0182815 A1* | 7/2012 | Jeon et al. | 365/191 |

* cited by examiner

*Primary Examiner* — Richard Elms
*Assistant Examiner* — Mohammed A Bashar
(74) *Attorney, Agent, or Firm* — Muncy, Geissler, Olds & Lowe, P.C.

(57) ABSTRACT

A storage medium communicating with a memory controller sent a read command is disclosed. The storage medium includes a plurality of memory units. Each memory unit includes at least sixteen memory cells coupled to a word line and a plurality of bit lines. A controlling unit receives first address information according to the read command and generates a row read signal and a column read signal according to the first address information. A row decoding unit activates the word line according to the row read signal. A column decoding unit activates the bit lines according to the column read signal to output a plurality of storing bits stored in the sixteen memory cells. A read-out unit processes the storing bits to generate a plurality of reading bits. The controlling unit outputs the reading bits to the memory controller in serial.

17 Claims, 2 Drawing Sheets

STORAGE MEDIUM AND ACCESSING SYSTEM UTILIZING THE SAME

BACKGROUND OF THE INVENTION

1. Field of the Invention

The invention relates to a storage medium, and more particularly to a storage medium utilizing serial peripheral interface (SPI) to communication data.

2. Description of the Related Art

Generally, storage mediums comprise volatile memories and non-volatile memories. Volatile memory is memory wherein data stored thereto is erased when power provided to the memory is interrupted. On the contrary, non-volatile memory is memory wherein data stored thereto is not erased when power provided to the memory is interrupted. Thus, non-volatile memories are widely used in various mobile digital devices. Common non-volatile memories comprise read-only memories (ROMs), programmable read-only memories (PROMs), erasable programmable read-only memories (EPROMs), electrically erasable programmable read-only memories (EEPROMs), and flash memories.

BRIEF SUMMARY OF THE INVENTION

An exemplary embodiment of a storage medium for communicating with a memory controller sent a read command, comprises a plurality of memory units, a controlling unit, a row decoding unit, a column decoding unit and a read-out unit. Each memory unit comprises at least sixteen memory cells coupled to a word line and a plurality of bit lines. The controlling unit receives first address information according to the read command and generates a row read signal and a column read signal according to the first address information. The row decoding unit activates the word line according to the row read signal. The column decoding unit activates the bit lines according to the column read signal to output a plurality of storing bits stored in the sixteen memory cells. The read-out unit processes the storing bits to generate a plurality of reading bits. The controlling unit outputs the reading bits to the memory controller in serial.

An exemplary embodiment of an accessing system comprises a memory controller and a storage medium. The memory controller sends a read command and first address information. The storage medium outputs at least sixteen reading bits to the memory controller in serial according to the read command and the first address information and comprises a plurality of memory units, a controlling unit, a row decoding unit, a column decoding unit and a read-out unit. Each memory unit comprises at least sixteen memory cells coupled to a word line and a plurality of bit lines. The controlling unit receives the first address information according to the read command and generates a row read signal and a column read signal according to the first address information. The row decoding unit activates the word line according to the row read signal. The column decoding unit activates the bit lines according to the column read signal to output a plurality of storing bits stored in the sixteen memory cells. The read-out unit processes the storing bits to generate a plurality of reading bits. The controlling unit outputs the reading bits to the memory controller in serial.

A detailed description is given in the following embodiments with reference to the accompanying drawings.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
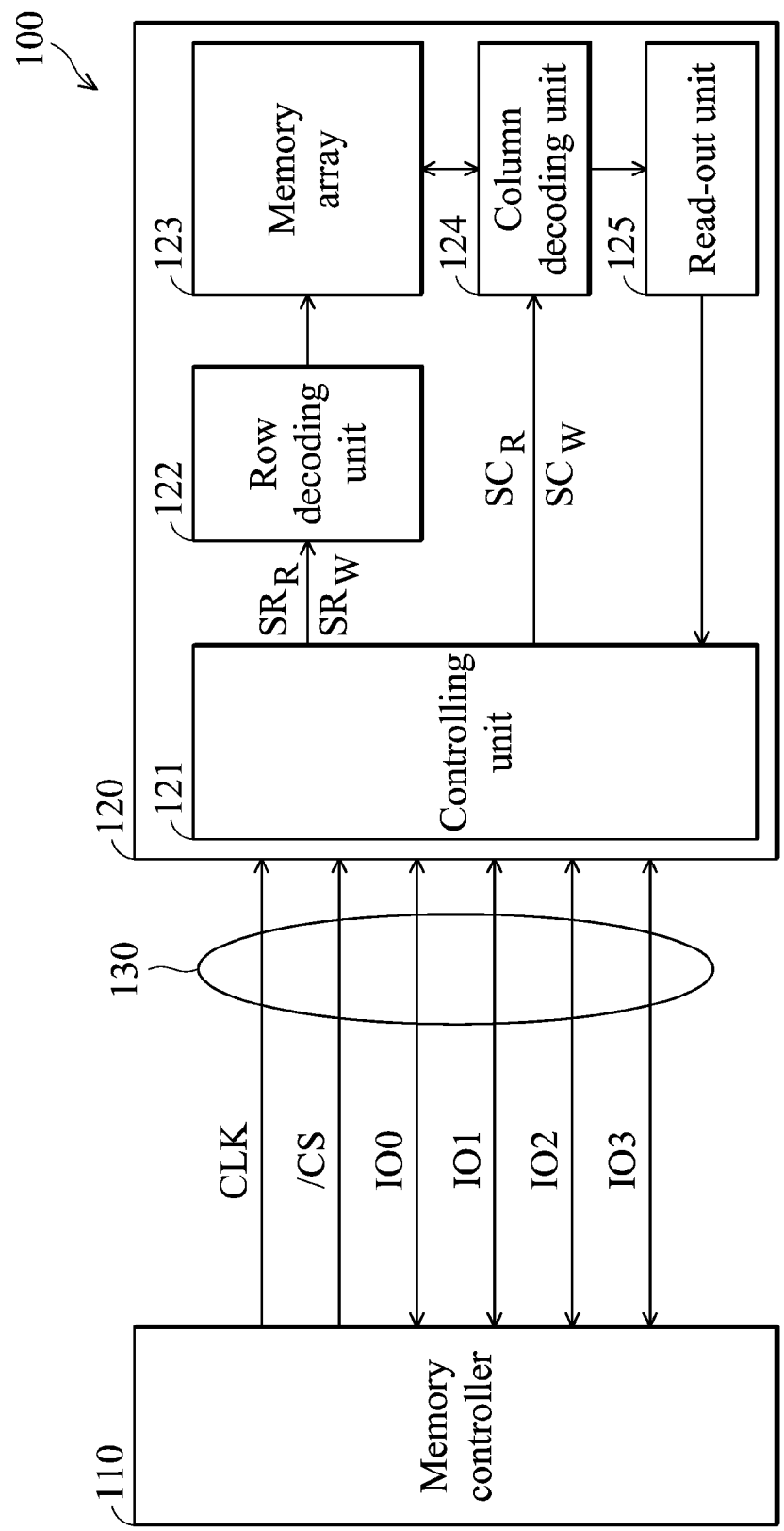
FIG. 1 is a schematic diagram of an exemplary embodiment of an accessing system of the invention.

FIG. 1 is a schematic diagram of an exemplary embodiment of an accessing system of the invention. The accessing system 100 comprises a memory controller 110 and a storage medium 120. The memory controller 110 accesses the storage medium 120. In one embodiment, the storage medium 120 communicates with the memory controller 110 via a serial peripheral interface (SPI) 130. The SPI 130 comprises pins CLK, /CS, and IO0~IO3. The pin CLK transmits a clock signal. The pin /CS transmits a chip select signal. The pins IO0~IO3 transmit command packages, address information and data packages. Note that the invention does not limit the kind of the storage medium 120. In this embodiment, the storage medium 120 is a non-volatile memory, such as a flash memory.

During a read mode, the memory controller 110 sends a read command and a read address information to the storage medium 120 via the pins IO0~IO3. The storage medium 120 outputs at least sixteen reading bits to the memory controller 110 according to the read command and the read address information, wherein the 16 bits is transmitted in serial and the 16 bits are referred to reading bits. During a write mode, the memory controller 110 sends a write command and write address information to the storage medium 120. The storage medium 120 stores corresponding data according to the write command and the write address information.

In this embodiment, the storage medium 120 receives the read address information or the write address information via the pins IO0~IO3. During the write mode, the pins IO0~IO3 receive write data from the memory controller 110. During the read mode, the pins IO0~IO3 output at least sixteen reading bits to the memory controller 110. In one embodiment, at least one of the pins IO0~IO3 outputs the reading bits to the memory controller 110.

For each address information, the storage medium 120 provides at least sixteen bits to the memory controller 110 such that a transfer speed between the memory controller 110 and the storage medium 120 is increased.

In this embodiment, the storage medium 120 comprises a controlling unit 121, a row decoding unit 122, a memory array 123, a column decoding unit 124 and a read-out unit 125. The controlling unit 121 receives a command provided from the memory controller 110 to identify whether the received command is a read command or a write command. The controlling unit 121 generates corresponding control signals according to the identification result. In one embodiment, the controlling unit 121 is constituted by hardware elements, such as a SPI command control logic circuit.

During the read mode, the memory controller 110 sends a read command and read address information to the controlling unit 121. The controlling unit 121 generates a row read signal $SR_R$ and a column read signal $SC_R$ according to the read command and the read address information. During the write mode, the memory controller 110 sends a write command and write address information to the controlling unit 121. The controlling unit 121 generates a row write signal $SR_W$ and a column write signal $SC_W$ according to the write command and the write address information.

The row decoding unit 122 activates a word line of the memory array 123 according to the output ($SR_R$ or $SR_W$) of the controlling unit 121. In one embodiment, the row decoding unit 122 comprises a counter (not shown) to activate word lines sequentially.

The column decoding unit 124 activates a plurality of bit lines of the memory array 123 according to the output ($SC_R$ or $SC_W$) of the controlling unit 121 for accessing memory cells coupled to the activated bit lines. The invention does not limit the number of bit lines to be activated. In this embodiment, the column decoding unit 124 activates sixteen bit lines to access sixteen memory cells every time. In other embodiments, the column decoding unit 124 activates thirty-two or sixty-four bit lines.

During a read mode, the column decoding unit 124 outputs the data stored in memory cells coupled to the activated bit lines. In one embodiment, the bit number of the output data is a multiple of 16.

In a write mode, the controlling unit 121 receives write data sent from the memory controller 110. The column decoding unit 124 writes at least one bit to at least one memory cell every time. The invention does not limit the number of bits written to the memory cell every time. In one embodiment, the column decoding unit 124 writes sixteen bits to sixteen memory cells respectively. In another embodiment, the sixteen bits are divided into two groups and each group has eight bits. In this case, the column decoding unit 124 writes the eight bits of one group to the corresponding memory cells and then writes the eight bits of another group to the corresponding memory cells. In other embodiments, the column decoding unit 124 writes two, four or six bits to the corresponding memory cells every time.

The read-out unit 125 processes the at least sixteen storing bits sent from the column decoding unit 124 to generate a plurality of reading bits. In one embodiment, the read-out unit 125 detects the at least sixteen storing bits to identify that each storing bit is 0 or 1. In this embodiment, the read-out unit 125 amplifies the storing bits and transmits the amplified result to the memory controller 110 in serial.

The invention does not limit the circuit structure of the read-out unit 125. In one embodiment, the read-out unit 125 comprises at least sixteen detection amplifiers (not shown) and at least sixteen latches (not shown). The detection amplifiers amplify the storing bits stored in the memory cells to generate a plurality of reading bits. The latches latch the reading bits and output the latched bits in serial. In this embodiment, the number of the amplifiers is the same as the number of the latches and the same as the number of the activated bit lines.

Figure 2:
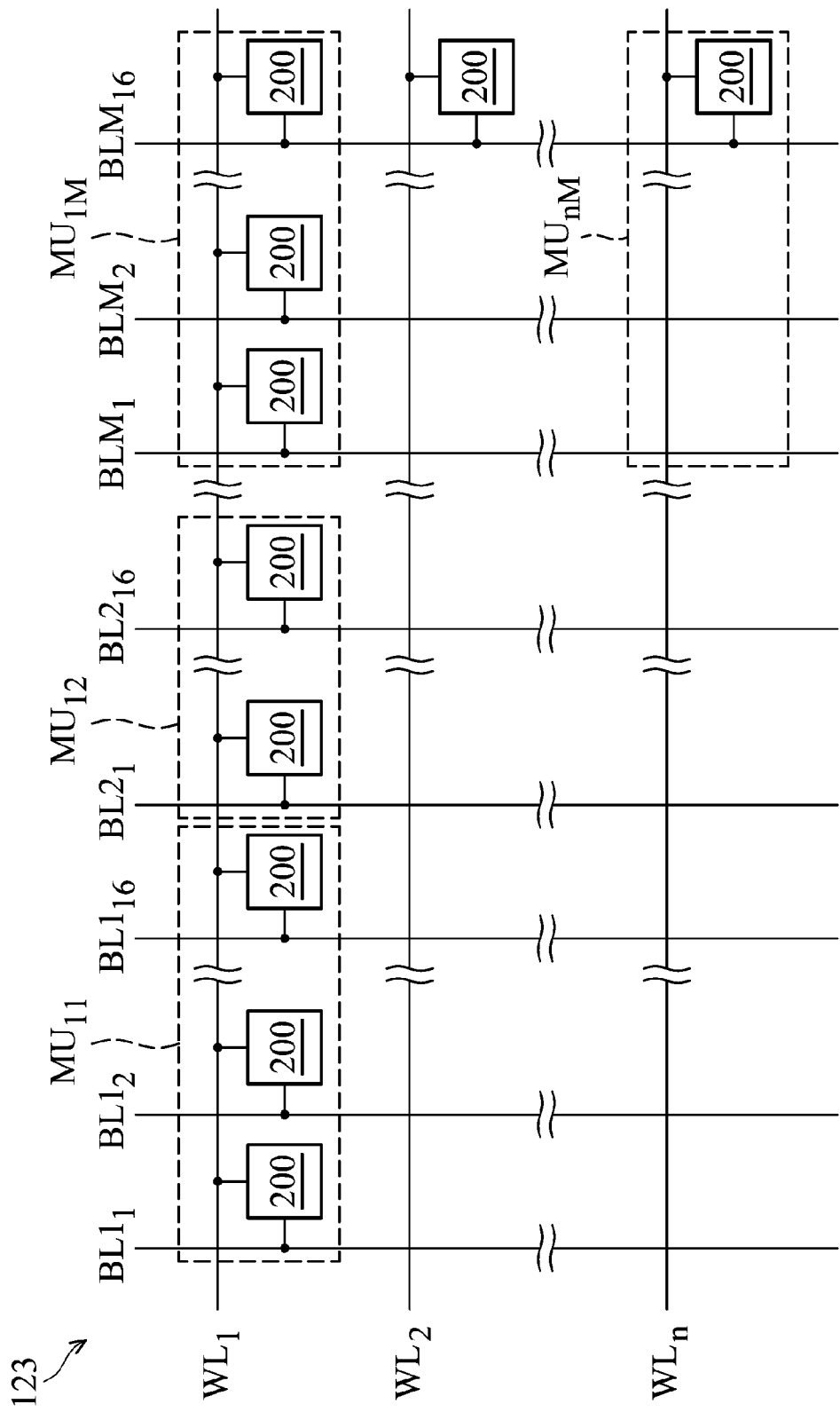
FIG. 2 is a schematic diagram of an exemplary embodiment of a memory array.

FIG. 2 is a schematic diagram of an exemplary embodiment of a memory array. The memory array 123 comprises a plurality of word lines $WL_1 \sim WL_n$, a plurality of bit lines $BL1_1 \sim BL1_{16}$, $BL2_1 \sim BL2_{16}$, $BLM_1 \sim BLM_{16}$ and a plurality of memory cells 200. Each memory cell 200 is coupled to a corresponding word line and a corresponding bit line.

In this embodiment, every sixteen memory cells coupled to the same word line constitutes a memory unit. For example, the memory cells coupled to the word line $WL_1$ and the bit lines $BL1_1 \sim BL1_{16}$ constitute a memory unit $MU_{11}$. In other embodiments, the number of the memory cells of one memory unit is a multiple of 16. For example, each memory unit comprises thirty-two or sixty-four memory cells.

In this embodiment, each memory unit corresponds to one address information. Assuming that read address information is 0000 0000 0000 0000 0000 0000, the controlling unit 121 generates the row read signal $SR_R$ and the column read signal $SC_R$ according to the read address information. The row decoding unit 122 activates the word line $WL_1$ according to the row read signal $SR_R$. The column decoding unit 124 activates the bit lines $BL1_1 \sim BL1_{16}$ according to the column read signal $SC_R$ for sending 16 bits stored in the memory unit $MU_{11}$ to the memory controller.

In this embodiment, the number of the memory cells in one memory unit is the same as the number of the detection amplifiers or the latches, but the disclosure is not limited thereto. In other embodiments, the number of the detection amplifiers or the latches of the read-out unit 125 may be less than the number of the memory cells in one memory unit when the detection amplifiers and the latches of the read-out unit 125 are capable of processing the bits stored in the memory cells.

For each address information, the invention can provide at least sixteen bits such that the transfer speed of the storage medium is increased, without increasing the pin number of the storage medium. Thus, the size of the storage medium does not change. In addition, the memory controller only sends one address information and does not send other information (e.g. increasing information) and the storage medium outputs at least sixteen bits. Thus, the complexity of the communication between the memory controller and the storage medium is not increased.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A storage medium for communicating with a memory controller sent a read command, comprising:
    a plurality of memory units, each comprising at least sixteen memory cells coupled to a word line and a plurality of bit lines;
    a controlling unit comprising a SPI command control logic circuit and receiving first address information according to the read command and generating a row read signal and a column read signal according to the first address information;
    a row decoding unit activating the word line according to the row read signal;
    a column decoding unit activating the bit lines according to the column read signal to output a plurality of storing bits stored in the sixteen memory cells; and
    a read-out unit processing the storing bits to generate a plurality of reading bits, wherein the controlling unit outputs the reading bits to the memory controller in serial,
    wherein the column decoding unit activates at least sixteen bit lines to access one of the memory units every time so as to make the storage medium to output at least sixteen bits for each first address information; and
    wherein the storage medium communicates with the memory controller via a serial peripheral interface, and the serial peripheral interface utilizes only six pins for transmitting a clock signal, a chip select signal, command packages, the first address information and data packages.

2. The storage medium as claimed in claim 1, further comprising:
    at least one pin receiving the first address information.

3. The storage medium as claimed in claim 1, wherein the read-out unit comprises:
   at least sixteen amplifiers amplifying the storing bits to generate the reading bits; and
   at least sixteen latches storing the reading bits and outputting the reading bits in serial.

4. The storage medium as claimed in claim 3, wherein the number of the amplifiers is the same as the number of the latches and is the same as the number of the memory cells of each memory unit.

5. The storage medium as claimed in claim 1, wherein the number of the memory cells of each memory unit is a multiple of 16.

6. The storage medium as claimed in claim 1, wherein when the memory controller sends a write command to the controlling unit, the controlling unit receives second address information according to the write command and generates a row write signal and a column write signal according to the second address information, wherein the row decoding unit activates the word line according to the row write signal, and the column decoding unit activates the bit lines according to the column write signal to write sixteen bits to the sixteen memory cells.

7. The storage medium as claimed in claim 6, wherein the column decoding unit writes the sixteen bits to the sixteen memory cells simultaneously.

8. The storage medium as claimed in claim 6, wherein the column decoding unit writes at least one of the sixteen bits to at least one of the sixteen memory cells every time.

9. An accessing system comprising:
   a memory controller sent a read command and first address information; and
   a storage medium, communicating with the memory controller via a serial peripheral interface utilizing only six pins for transmitting a clock signal, a chip select signal, command packages, the first address information and data packages and outputting at least sixteen reading bits to the memory controller in serial according to the read command and the first address information, the storage medium comprising:
   a plurality of memory units, each comprising at least sixteen memory cells coupled to a word line and a plurality of bit lines;
   a controlling unit comprising a SPI command control logic circuit and receiving the first address information according to the read command and generating a row read signal and a column read signal according to the first address information;
   a row decoding unit activating the word line according to the row read signal;
   a column decoding unit activating the bit lines according to the column read signal to output a plurality of storing bits stored in the sixteen memory cells; and
   a read-out unit processing the storing bits to generate the plurality of reading bits, wherein the controlling unit outputs the reading bits to the memory controller in serial,
   wherein the column decoding unit activates at least sixteen bit lines to access one of the memory units every time so as to make the storage medium to output at least sixteen bits for each first address information.

10. The accessing system as claimed in claim 9, further comprising:
   at least one pin receiving the first address information.

11. The accessing system as claimed in claim 9, wherein the read-out unit comprises:
   at least sixteen amplifiers amplifying the storing bits to generate the reading bits; and
   at least sixteen latches storing the reading bits and outputting the reading bits in serial.

12. The accessing system as claimed in claim 11, wherein the number of the amplifiers is the same as the number of the latches and is the same as the number of the memory cells of each memory unit.

13. The accessing system as claimed in claim 9, wherein the number of the memory cells of each memory unit is a multiple of 16.

14. The accessing system as claimed in claim 9, wherein when the memory controller sends a write command, the controlling unit receives second address information according to the write command and generates a row write signal and a column write signal according to the second address information, wherein the row decoding unit activates the word line according to the row write signal, and the column decoding unit activates the bit lines according to the column write signal to write sixteen bits to the sixteen memory cells.

15. The accessing system as claimed in claim 14, wherein the column decoding unit writes the sixteen bits to the sixteen memory cells simultaneously.

16. The accessing system as claimed in claim 14, wherein the column decoding unit writes at least one of the sixteen bits to at least one of the sixteen memory cells every time.

17. The storage medium as claimed in claim 1, wherein each memory unit corresponds to one address package.

* * * * *